United States Patent
Kowalczyk et al.

(10) Patent No.: US 10,678,113 B1
(45) Date of Patent: Jun. 9, 2020

(54) LOW IMPEDANCE OPTICAL MODULATOR

(71) Applicant: LOCKHEED MARTIN CORPORATION, Bethesda, MD (US)

(72) Inventors: Anthony C. Kowalczyk, San Carlos, CA (US); Xipeng Sui, Fremont, CA (US); Nicholas D. Saiz, San Jose, CA (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 0 days.

(21) Appl. No.: 16/255,751

(22) Filed: Jan. 23, 2019

(51) Int. Cl.
*G02F 1/225* (2006.01)
*G02F 1/21* (2006.01)

(52) U.S. Cl.
CPC ...... *G02F 1/2255* (2013.01); *G02F 2001/212* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 7,515,775 B1* | 4/2009 | Kucharski | ............... | G02F 1/025 385/1 |
| 2011/0206322 A1* | 8/2011 | Kucharski | ............ | G02B 6/4274 385/39 |
| 2012/0105149 A1* | 5/2012 | Saiz | ........................ | H03F 3/211 330/124 R |
| 2015/0295650 A1* | 10/2015 | Lee | ..................... | H04B 10/2575 398/115 |
| 2016/0112016 A1* | 4/2016 | Lakshmikumar | ... | H03F 3/45659 330/260 |
| 2016/0191167 A1* | 6/2016 | Cox | ....................... | G02F 1/2255 398/183 |

OTHER PUBLICATIONS

Prasad, S.N., et al., "Power-Bandwidth Considerations in the Design of MESFET Distributed Amplifiers," IEEE Transactions on Microwave Theory and Techniques, vol. 36, No. 7, pp. 1117-1123, Jul. 1988.

* cited by examiner

*Primary Examiner* — Jerry Rahll
(74) *Attorney, Agent, or Firm* — Morgan, Lewis & Bockius LLP (57) ABSTRACT

Systems and methods are provided for a low impedance optical modulator in an optical device. The optical device includes a distributed amplifier having a plurality of gain stages and is configured to receive a radio frequency (RF) signal at an input of the distributed amplifier having a first impedance and provide an amplified version of the RF signal with a voltage gain produced through the plurality of gain stages to an output of the distributed amplifier having a second impedance smaller than the first impedance. The optical device includes an optical modulator coupled to the distributed amplifier and is configured to receive the amplified version of the RF signal at an input of the optical modulator having a same impedance as the output of the distributed amplifier and modulate the amplified version of the RF signal to produce an intensity modulated optical signal at an output of the optical modulator.

20 Claims, 5 Drawing Sheets

LOW IMPEDANCE OPTICAL MODULATOR

STATEMENT REGARDING FEDERALLY SPONSORED RESEARCH OR DEVELOPMENT

Not applicable.

FIELD

The present disclosure generally relates to optical communication systems, and more particularly, to a low impedance optical modulator.

BACKGROUND

Radio receivers using standard Mach-Zehnder modulator (MZM) electrodes require wide electrode gaps to achieve 50-ohm impedance that ultimately limits the figure of merit for optical modulators.

SUMMARY

In some aspects, the subject technology is related to optical systems for wideband communications. To achieve a lower half-wave voltage, $V\pi$, design, the optical modulator electrode requires a smaller gap width of the coplanar waveguide in the electrode. By forming a smaller gap width, the impedance of the transmission line is significantly lesser than 50 ohms (i.e., smaller than the impedance of standard components). To achieve the lesser impedance, the optical modulator is implemented with a distributed amplifier having a 50-ohm input, and a relatively low impedance output. This in effect places the distributed amplifier input to match the impedance of standard components. The output of the distributed amplifier is tuned to match the low impedance of the optical modulator and the output of the distributed amplifier is terminated by a low impedance resistor.

In one embodiment of the subject technology, an optical device includes a distributed amplifier having a plurality of gain stages. In some aspects, the distributed amplifier is configured to receive a radio frequency (RF) signal at an input of the distributed amplifier having a first impedance and provide an amplified version of the RF signal with a voltage gain produced through the plurality of gain stages to an output of the distributed amplifier having a second impedance smaller than the first impedance. The optical device also includes an optical modulator coupled to the distributed amplifier and configured to receive the amplified version of the RF signal at an input of the optical modulator having a same impedance as the output of the distributed amplifier and modulate the amplified version of the RF signal to produce an intensity modulated optical signal at an output of the optical modulator.

In one embodiment of the subject technology, a method includes receiving a RF signal at an input of a distributed amplifier having a first impedance. The method includes providing an amplified version of the RF signal with a voltage gain produced through a plurality of gain stages of the distributed amplifier to an output of the distributed amplifier having a second impedance smaller than the first impedance. The method includes receiving the amplified version of the RF signal at an input of an optical modulator having a same impedance as the second impedance. The method includes modulating the amplified version of the RF signal through the optical modulator to produce an intensity modulated optical signal. The method includes terminating an output of the optical modulator with a termination resistive element having a same impedance as the optical modulator. The method also includes providing the intensity modulated optical signal to a detector.

In one embodiment of the subject technology, an optical system includes an optical driver configured to produce an optical train pulse. The optical system includes a distributed amplifier coupled to an antenna and configured to provide an amplified version of a RF signal received from the antenna through a plurality of gain stages to an output of the distributed amplifier having an impedance that is smaller than that at an input of the distributed amplifier. The optical system includes an optical modulator coupled to the distributed amplifier and configured to receive the amplified version of the RF signal at an input of the optical modulator having a same impedance as the output of the distributed amplifier and modulate the amplified version of the RF signal with the optical train pulse to produce an intensity modulated optical signal at an output of the optical modulator. The optical system also includes a termination resistive element coupled to the output of the optical modulator and configured to terminate the output of the optical modulator with a same impedance as the optical modulator.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations. In one or more instances, well-known structures and components are shown in block diagram form in order to avoid obscuring the concepts of the subject technology.

RF amplifiers are typically designed for a specific system impedance, e.g., $Z_0=50\Omega$ or $75\Omega$ impedance, which is typical for systems designed using discrete components. To achieve a low $V_\pi$ design on the MZM, the circuitry topology needs a lower impedance (e.g., 30 ohm). A lower $V_\pi$ design is more desirable because the lower driving voltage helps achieve improved gain and lower noise figure for a photonic link (both of which are variable attributes of a radio receiver). In general, there is a tradeoff between the impedance of the optical modulator, such as MZM, and the half-wave voltage ($V_\pi$) of the optical modulator, depending on application.

In some approaches, a standard system implements transformers to achieve a lower impedance but this would add insertion loss, unnecessary return loss, and limited bandwidth. For example, if the impedance is lower than the standard 50-Ohm impedance, then a quarter-wave transformer is used to transform the impedance from a standard value (e.g., 50 ohms) to that of the optical modulator (e.g., 30 ohms), but the transformer limits the achievable bandwidth and adds extra insertion loss.

The present disclosure describes an RF-to-optical system-in-package (SiP) for wireline communications, wireless communications, and frequency agnostic radios. The subject technology includes implementation of an optical modulator, such as the MZM, and a wideband amplifier to optimize system performance. System-in-package design techniques are utilized to design a system impedance that is suitable for specific design needs. More specifically, the subject technology includes optimization of the wideband amplifier to have an output impedance that matches the optimal RF waveguide impedance of the MZM.

To achieve a low half-wave voltage, $V_\pi$, and also maintain an impedance-matched system to minimize the return loss, the subject technology includes a low impedance modulator electrode that is fed by a low impedance output of a distributed amplifier that serves as a wideband low-noise amplifier (LNA). The LNA has an input impedance of 50 ohms and a low output impedance that matches the transmission line impedance of the MZM. The MZM is terminated with a resistor that also matches the transmission line impedance of the MZM. The combination produces a modulator half-wave voltage that is at least a five-fold improvement over other commercial RF devices and results in at least 10 dB improved gain without sacrificing bandwidth, which can extend in a range of 10 GHz to 100 GHz.

The distributed amplifier has a specific circuit arrangement to help match the output impedance of the distributed amplifier with the low impedance of the MZM. By removing the quarter-wave transformer from the circuit topology, it significantly improves the return loss/insertion loss values and achieves a wider bandwidth. In one or more embodiments, the half-wave voltage, $V_\pi$, is lower, and is not limited by the transmission line impedance of the MZM.

Figure 1:
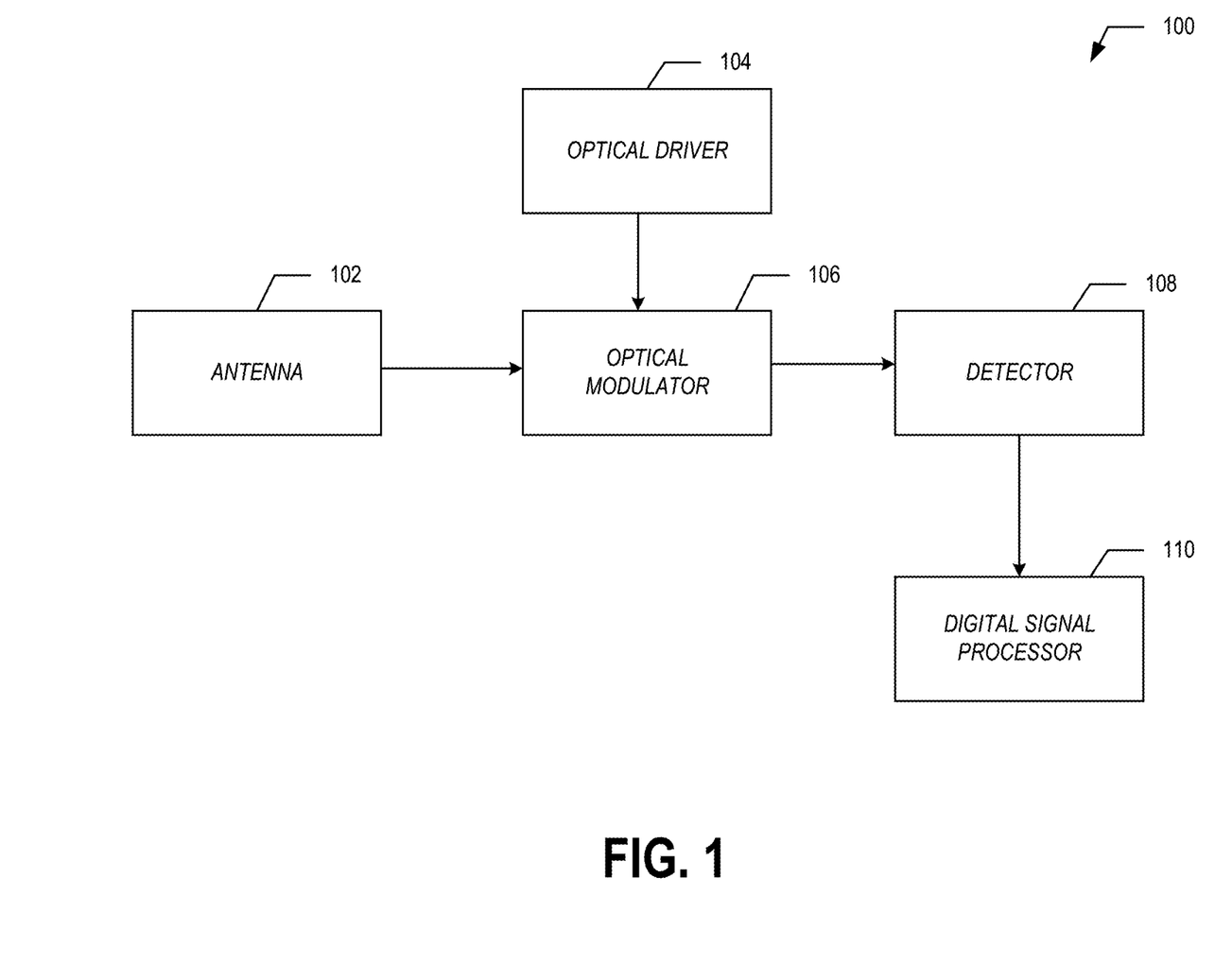
FIG. 1 is a conceptual block diagram illustrating an exemplary optical system according to some implementations of the subject technology.

FIG. 1 is a conceptual block diagram illustrating an exemplary optical system 100 according to some implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The optical system 100 performs optical modulation of an RF signal in an optical domain. The optical system 100 includes an antenna 102, an optical driver 104, an optical modulator 106, a detector 108, and a digital signal processor 110. The antenna 102 receives an input RF signal having a carrier frequency and amplitude information. The optical driver 104 generates an optical pulse train having a plurality of optical pulses that serves as a driving pattern to help produce modulated optical intensity. The optical modulator 106 modulates the RF signal onto an optical carrier using the optical pulse train to generate an intensity modulated optical signal having the amplitude information of the RF signal at a plurality of times corresponding to the plurality of optical pulses of the optical pulse train. The intensity modulated optical signal may be defined by a maximum output optical intensity and a minimum output optical intensity.

In accordance with various aspects of the subject technology, the optical modulator 106 may be an electro-absorption modulator ("EAM"), a Mach-Zehnder interferometer ("MZI"), or the like. In some aspects, a Mach-Zehnder interferometer is a device used to determine the relative phase shift variations between two collimated beams derived by splitting light from a single source. Mach-Zehnder interferometers are used in electro-optic modulators, and electronic devices used in various fiber-optic communication applications. Mach-Zehnder modulators ("MZM") are incorporated in monolithic integrated circuits and provide high-bandwidth electro-optic amplitude and phase responses over a multiple-gigahertz frequency range. The optical modulator 106 performs intensity modulation by absorption coefficient variation under an electric field in some implementations. In other implementations, the optical modulator 106 performs phase modulation by refractive index variation under an electric field.

The optical modulator 106 then provides the intensity modulated optical signal to a detector, such as a photodetector, to generate an electrical waveform having the amplitude information of the input RF signal. The optical system 100 processes the electrical waveform by using the signal processor 110, such as either an analog processor or a digital signal processor.

Figure 2A:
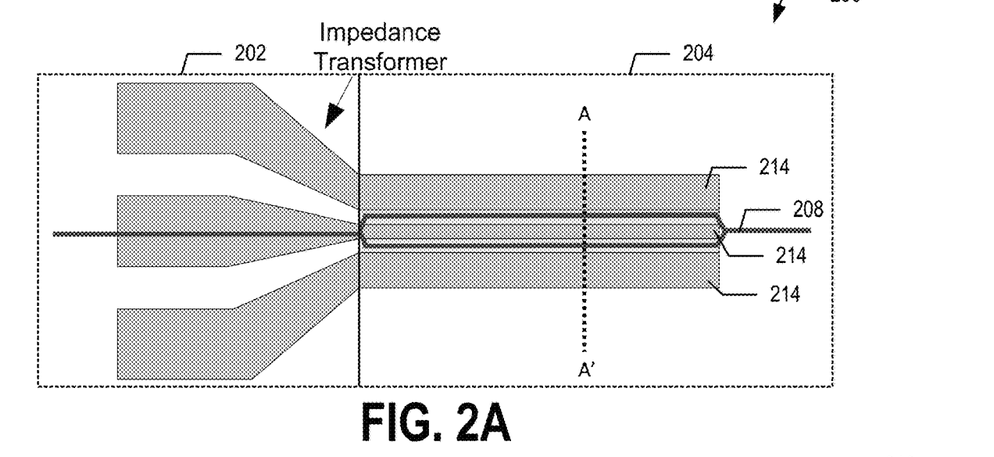
FIG. 2A is a conceptual diagram illustrating a top view of an example of an optical device having an impedance transformer and an optical modulator according to some implementations of the subject technology.

FIG. 2A is a conceptual diagram illustrating a top view of an example of an optical device 200 having an impedance transformer 202 and an optical modulator 204 according to some implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

In a standard microwave design, $Z_0=50\Omega$ is generally the system characteristic impedance used in all microwave components, including commercial RF components that utilize 50 Ohm impedance. Departure from 50 Ohms creates significant power reflection. In some approaches, the optical modulator electrode lengths are longer. This keeps devices at 50-Ohm impedance, but are much longer in length. This may be an effective means for decreasing the half-wave voltage, $V_\pi$, but the optical system sacrifices bandwidth associated with RF electrode loss and velocity matching. In other approaches, an impedance transformer includes narrower electrode gaps compared to 50-Ohm devices that can be utilized, but these optical devices include quarter-wavelength impedance transformers having limited bandwidth.

In a traditional design, an amplifier (not shown) has a 50-ohm input and a 50-ohm output. In a traditional 50-ohm design, the return loss for an architecture that includes 50 ohms on one side and a relative low impedance on the other side needs to use an impedance transformer 202. In accordance with various aspects of the subject technology, the impedance transformer 202 may be a quarter-wavelength transformer. After the impedance transformer 202, there is a low impedance optical modulator (e.g., 204). In accordance with various aspects of the subject technology, the optical modulator 204 may be a MZM, an electro-absorption modulator, or the like.

The optical device 200 includes a coplanar waveguide electrode 214 along a longitudinal length of the impedance transformer 202 and the optical modulator 204. In some aspects, the coplanar waveguide electrode 214 is, or includes, an RF trace. As depicted in FIG. 2A, the impedance transformer 202 transforms the 50-ohm impedance to the line impedance of the optical modulator 204, which is usually lower than 50 ohms (e.g., 30-40 ohms). In some implementations, the optical device 200 includes a photonics fiber 208 that is buried between the gap of the coplanar waveguide electrode. At the output of the optical modulator 204, there is a termination resistor (not shown) that terminates at the same impedance of the optical modulator 204.

In a radio frequency (RF) system, it is critical for the impedance match all components to reduce power reflections and maximize power transfer. A mismatch in impedance can be characterized by the reflection coefficient, $$\Gamma = \frac{Z_L - Z_0}{Z_L + Z_0},$$

where $Z_L$ is the load impedance and $Z_0$ is the source impedance. The percentage of power loss due to reflection can be characterized as $P_d/P_i=1-\Gamma^2$. In traditional design practice, the load impedance $Z_L$ and source impedance $Z_0$ are kept to be 50 Ohm. In an ideal case, the reflection coefficient would be zero, and the maximum power is transferred to the desired load.

The impedance transformer 202 transforms the 50-Ohm input impedance to match the line impedance of the MZM (e.g., 30 Ohms, 40 Ohms) but that limits the bandwidth of the optical device 200 because the impedance transformer 200 does not transform the impedance across the entire band. This worsens the return loss at other frequencies of the band. The impedance transformer 200 also adds extra insertion loss into the system. The combination of increased return loss and insertion loss significantly limits the bandwidth and gain of the optical device 200.

Figure 2B:
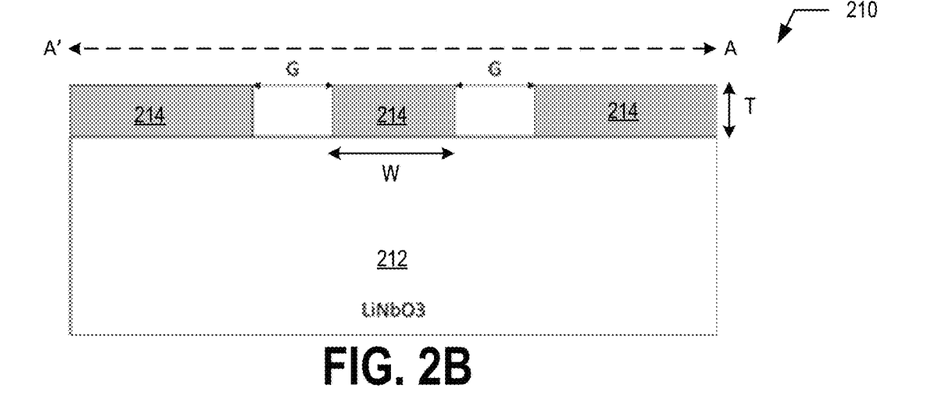
FIG. 2B is a conceptual diagram illustrating a cross-sectional view of an optical device according to some implementations of the subject technology.

FIG. 2B is a conceptual diagram illustrating a cross-sectional view of an optical device 210 according to some implementations of the subject technology. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The optical device 210 corresponds to the optical device 200 of FIG. 2A along the A-A' axis. As depicted in FIG. 2B, the optical device 210 includes a coplanar waveguide electrode 214 on a substrate 212. The substrate 212 includes an electro-optic material, such as Lithium Niobate (LiNbO$_3$). Lithium niobate based optical modulators may be widely used in digital and analog communication industries. In other implementations, the substrate 212 includes a semiconductor material, such as Silicon (Si).

In traditional design, the RF electrodes are typically implemented using coplanar waveguides, and G represents the gap width of the coplanar waveguide electrode 214 as shown in FIG. 2B. The characteristic impedance of the optical device 210 depends on the electrode design structure, such as the coplanar waveguide electrode 214. For example, the coplanar waveguide electrode 214 may be formed with a specific center electrode width (W) and electrode thickness (T) in conjunction with the gap width to achieve a certain modulator impedance.

The Figure of Merit (FOM) of the optical device 210 includes, among others, the half-wave voltage, $V_\pi$, value, return loss value, and insertion loss value. The half-wave voltage, $V_\pi$, describes the voltage amplitude required to invert the phase of an AC signal by 180-degrees. It is desirable to minimize $V_\pi$, as it relaxes the voltage swing requirements of the driving amplifier. For example, it is desirable to have $V_\pi$ values less than 1V (compared to 2.5V, 3V of standard commercial components). For design of the coplanar waveguide electrode 214 on a Lithium Niobate (LiNbO$_3$) substrate 212, the half-wave voltage, $V_\pi$, is given by:

$$V_\pi = \frac{\lambda G}{n_0^3 r_{33} \Gamma L} \quad \text{Equation (1)}$$

where $\lambda$ is the free-space optimal wavelength, G is the gap between RF electrodes, $n_o$ is the effective refractive index of optical wave, $r_{33}$ is electro-optic coefficient of LiNbO$_3$, $\Gamma$ is the overlap integral of electric and optical fields, and L is the length of RF electrodes.

Figure 2C:
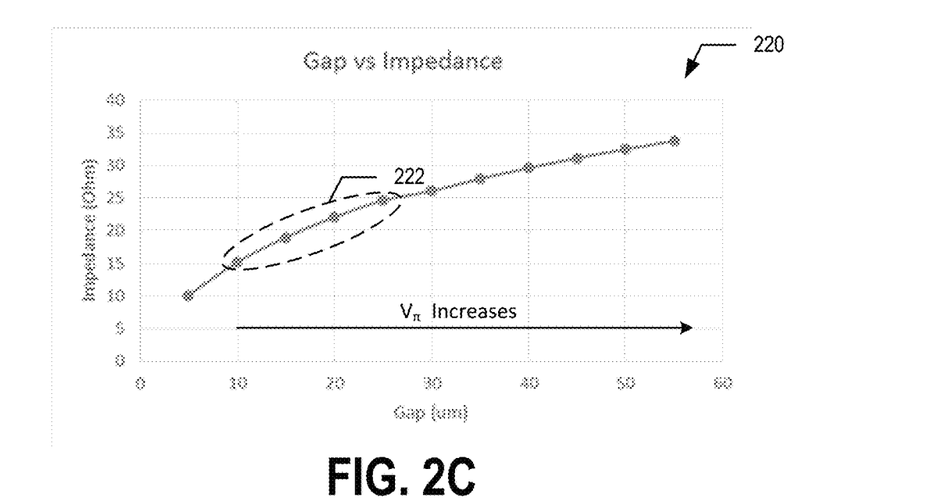
FIG. 2C is a plot diagram illustrating impedance of a coplanar waveguide as a function of the electrode gap width according to some implementations of the subject technology.

FIG. 2C is a plot diagram 220 illustrating impedance of a coplanar waveguide as a function of the electrode gap width according to some implementations of the subject technology. The plot diagram 220 includes the electrode gap width in terms of micrometers on the x-axis, and includes the line impedance of the optical modulator on the y-axis. As the gap width increases, the half-wave voltage, Vim, also increases. The plot diagram 200 illustrates the impedance as a function of the gap width as the primary factor for a given width and thickness of the coplanar waveguide electrodes (e.g., 214).

The most direct way to lower $V_\pi$ is by reducing the gap of the electrode. In this respect, the FOM for the optical modulator 204 primarily depends on the electrode gap width. However, reducing the gap of the coplanar waveguide electrode 214 will also decrease the line impedance of the optical modulator 204, and therefore, a process of impedance matching is required. The gap is often very large for a 50-Ohm design in MZM, and therefore the line impedance often limits the gap space in the design, and impedance becomes a tradeoff with $V_\pi$ as illustrated in FIG. 2C. In a traditional MZM design, a quarter-wavelength transformer is generally used in a non 50-Ohm line impedance design, which limits the bandwidth and performance. A gap width is then selected to compromise both $V_\pi$ and line impedance requirements.

In some examples, a lower $V_\pi$ may correspond to an impedance in a range of 15 Ohms to 25 Ohms (e.g., 224), which respectively correspond to a gap width in a range of 10 µm to 25 µm. The gap width for a half-wave voltage, Vim, that is less than 1V is in a range of 5-20 µm in some implementations, and in a range of 20 µm-50 µm in other implementations.

Figure 3:
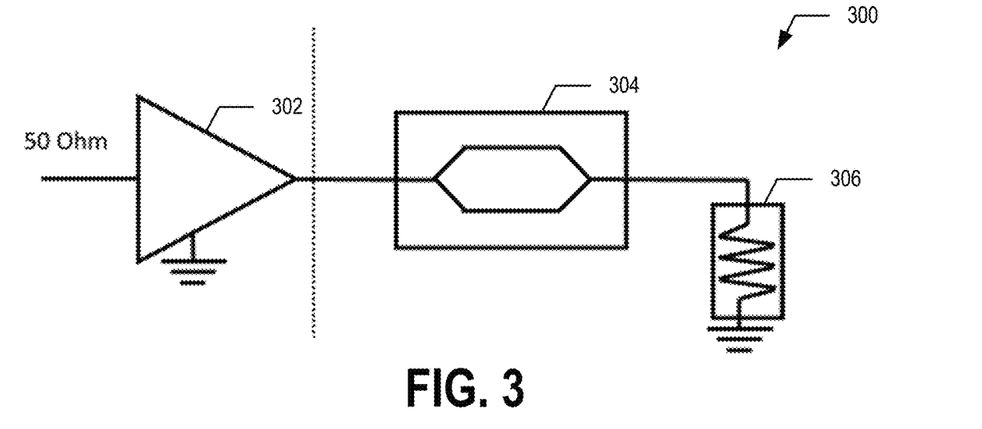
FIG. 3 is a schematic diagram illustrating an example of an optical device having a low impedance MZM circuit according to one or more implementations of the subject technology is illustrated.

FIG. 3 is a schematic diagram illustrating an example of an optical device 300 having a low impedance MZM circuit according to one or more implementations of the subject technology is illustrated. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The optical device 300 includes an amplifier circuit element 302, an optical modulator circuit element 304, and a termination circuit element 306. To achieve a low $V_\pi$ and also maintain an impedance-matched system to minimize the return loss, the optical device 300 includes the low impedance MZM circuit 304 in series with the low-noise amplifier circuit 302 in a custom impedance design. In some implementations, there is a direct coupling between the amplifier circuit element 302 and the optical modulator circuit element 304. The dotted vertical line represents where the transition in impedance occurs. In accordance with various aspects of the subject technology, the amplifier circuit element 302 is a distributed amplifier that serves as a low noise amplifier. In accordance with various aspects of the subject technology, the optical modulator circuit element 304 may be a low impedance MZM, an electro-absorption modulator, or the like.

In some implementations, the amplifier circuit element 302 and the optical modulator circuit element 304 are formed on separate semiconductor dies. For example, the amplifier circuit element 302 may be formed with a Silicon substrate, whereas the optical modulator circuit element 304 may be formed with a Lithium Niobate substrate. In other implementations, the amplifier circuit element 302 and the optical modulator circuit element 304 are formed on a same semiconductor die. For example, both the amplifier circuit element 302 and the optical modulator circuit element 304 are formed with a Silicon substrate.

As discussed above, RF amplifiers are typically designed for a specific system impedance, $Z_0=50\Omega$ or 75Ω impedance, which is typical for systems designed using discrete components. In the subject disclosure, system-in-package design techniques are utilized to design full-custom amplifiers, and thereby tune the system impedance that is suitable for specific wideband RF communication needs. More specifically, the subject disclosure includes optimization of the amplifier circuit element 302 in FIG. 3 to have an output impedance that is matched to the optimal RF waveguide impedance of the optical modulator circuit element 304.

The optical device 300 includes the amplifier circuit element 302 as a multi-stage distributed amplifier that has a 50-ohm input and the output of the amplifier circuit element 302 that is configurable to match the impedance of the optical modulator circuit element 304 to achieve the desired $V_\pi$ value. For example, the impedance at the output of the amplifier circuit element 302 can be as low as 15 ohms. It is desirable to minimize the impedance of optical modulator circuit element 304 to achieve the smaller $V_\pi$ values, and therefore, obtain greater gain results. The output of the optical modulator circuit element 304 is coupled to the termination circuit element 306 serving as a low impedance termination resistor (e.g., 15-25 ohm) that matches the MZM line impedance to terminate the output of the optical modulator circuit element 304 to ground, and therefore, prevent unnecessary RF reflections (e.g., ground the RF power so that it doesn't reflect back to the optical modulator circuit element 304 and the amplifier circuit element 302). The optical device 300 achieves a much wider bandwidth compared to standard 50-ohm microwave designs, since it does not require a quarter-wavelength transformer to transform the impedance. In the absence of the impedance transformer, there is no return loss and insertion loss introduced into the system.

Figure 4:
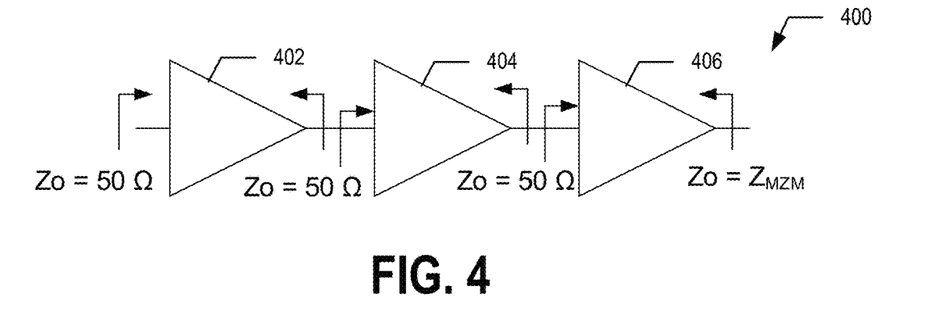
FIG. 4 is a schematic diagram illustrating an example of a distributed amplifier according to one or more implementations of the subject technology is illustrated.

FIG. 4 is a schematic diagram illustrating an example of a distributed amplifier 400 according to one or more implementations of the subject technology is illustrated. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

In some aspects, the distributed amplifier 400 corresponds to the amplifier circuit element 302 of FIG. 3 and serves as a lower-level circuit representation of the amplifier circuit element 302. The distributed amplifier 400 is used to simultaneously achieve wide instantaneous bandwidth, high gain, and wideband impedance matching. As depicted in FIG. 4, the distributed amplifier 400 includes three gain stages, where a first gain stage (e.g., 402) provides a first gain and a 50Ω input impedance to the outside world (e.g. test equipment or another radio block), the second gain stage (e.g., 404) provides a second gain and is also matched to the 50-Ω impedance. Finally, a third gain stage (e.g., 406) provides a third gain, 50Ω input impedance (to match the load of the second gain stage 404) and an output impedance that is matched to the impedance of the optical modulator circuit element 304. This approach enables to bypass the need for a quarter-wavelength impedance transformer, which consumes die area, increases return loss/insertion loss, and limits the RF-bandwidth of the optical modulator circuit element 304. In some aspects, the second gain matches the first gain. In other aspects, the second gain is greater than the first gain. In one or more implementations, the third gain is smaller than each of the first gain and the second gain.

As depicted in FIG. 4, the number of stages of the distributed amplifier 400 is 3, however, the number of stages included in the distributed amplifier 400 can be 2 stages or 4 stages for certain implementations. The amplifiers in each gain stage of the distributed amplifier 400 can be made of semiconductor materials, such as SiGe (Silicon Germanium) or GaAs (Gallium Arsenide), depending on implementation.

Figure 5:
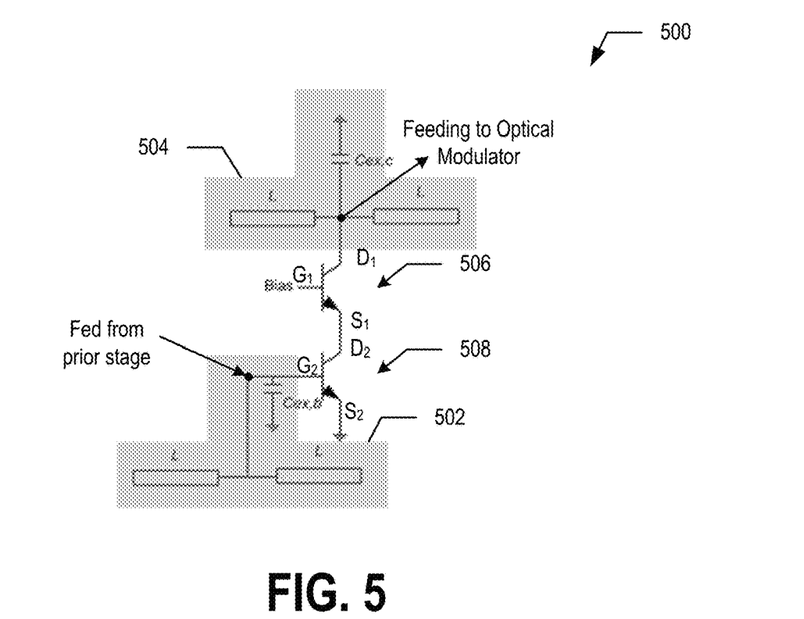
FIG. 5 is a schematic diagram illustrating an example of a unit segment of an amplifier according to one or more implementations of the subject technology is illustrated.

FIG. 5 is a schematic diagram illustrating an example of a unit segment of an amplifier 500 according to one or more implementations of the subject technology is illustrated. Not all of the depicted components may be required, however, and one or more implementations may include additional components not shown in the figure. Variations in the arrangement and type of the components may be made without departing from the spirit or scope of the claims as set forth herein. Additional components, different components, or fewer components may be provided.

The unit segment of the amplifier 500 includes an input stage 502 and an output stage 504. In some aspects, the input stage 502 is coupled to the output stage 504 through a first transistor 508 and a second transistor 506 coupled in series with the first transistor 508. The transistors 506 and 508 are implemented as BJT transistors in some implementations, or implemented as MOSFET transistors in other implementations. As depicted in FIG. 5, the input stage 502 is directly coupled to a first node (base $B_2$ for BJT or gate $G_2$ for MOSFET) of the first transistor 508 and the output stage 504 is directly coupled to a second node (collector $C_1$ for BJT or drain $D_1$ for MOSFET) of the second transistor 506. In some implementations, a third node (base $B_1$ for BJT or gate $G_1$ for MOSFET) of the second transistor 506 is biased by a bias signal that is set by a current mirror (not shown), where a voltage is supplied to the current mirror and produces the bias to the circuit.

In some implementations, the unit segment of the amplifier 500 serves as a lower-level circuit representation of one of the gain stages in the distributed amplifier 400. For example, as illustrated in FIG. 5, the unit segment corresponds to the last stage (or the third gain stage 406) of the distributed amplifier 400. The amplifier 500 may consist of a pair of transmission lines with characteristic impedances of Z0 independently connecting the inputs and outputs of several active devices (e.g., transistors 506, 508). An RF signal is thus supplied to the section of transmission line connected to the input of the first device (e.g., at node fed from input to the distributed amplifier or prior stage). As the input signal propagates down the input line, the individual devices respond to the forward traveling input step by inducing an amplified complementary forward traveling wave on the output line (e.g., at node that feeds to the optical modulator circuit element 304).

The two transistors (506, 508) provide the gain, and the transconductive gain of each transistor is $g_m$ and the output impedance seen by each transistor is half the characteristic impedance of the transmission line. In this respect, the overall voltage gain of the distributed amplifier (e.g., 302, 400) is: $A_v = \frac{1}{2} n \cdot g_m \cdot Z_0$, where n is the number of stages. The parasitics of the transistors (e.g., 506, 508) depends on the sizing of the transistors (e.g., W/L of transistor). The transistors are tuned with a certain W/L to achieve a certain transconductance gain. To achieve a higher gain, the width, W, of the transistor is increased, but draws more current. In some implementations, the first two stages (e.g., 402, 404) perform the gain. The output stage (e.g., 406) represents a buffer stage. The sizing between the two transistors in the output stage is typically the same. The sizing between the two transistors in the first two stages may be different. The sizing between the two transistors may be the same in one stage but may be different between two different stages to achieve an increase in gain between the two stages.

The impedance at the input and output of the amplifier 500 is achieved by synthesizing a transmission line formed by a series inductor and the parasitic shunt capacitance of a transistor, where L is a transmission line inductor, $C_{ex,b}$ is the total base (or gate) capacitance, $C_{ed,c}$ is the total collector (or drain) capacitance, $l_{seg}$ is the transmission line length, $v_{seg}$ is the phase velocity of the transmission line, $Z_0$ is the characteristic impedance of the transmission line, and $Z_{final}$ is the final desired characteristic impedance. In some aspects, the length of each synthetic transmission line is adjusted to tune the impedance at the input and the output, respectively. As depicted in FIG. 5, L represents the length of the transmission line, which provides the inductance for tuning. The relationship between $Z_{final}$, $l_{seg}$, and the external loading capacitances are utilized to determine the ideal transmission line impedance for the subject technology.

In some implementations, the impedance tuning is provided by a process suitable for the subject technology. In some aspects, $C_{ex,b}$ is assumed to be made up only of $C_\pi$ of the transistor, which is reasonable when using a cascode amplifier configuration. In other aspects, $Z_{final}$ is assumed to be known (or predetermined) and the values of $Z_0$ and $Z_{MZM}$ are predetermined, such as $Z_0 = 50$ and $Z_{MZM} = 25$. The process may first determine the maximum $Z_0$ of a transmission line for a given process using an electromagnetic (EM) field solver. The process then calculates the value for $l_{seg}$ for a given $Z_0$, $Z_{final}$, $C_{ex}$, $v_{line}$. In some aspects, to design the output transmission line, the value for lseg is first fixed to that of the base transmission line. Next, the value for $C_{ex}$ is determined, such that it results in the desired $Z_{final}$ matching $Z_{MZM}$. Finally, the process accounts for additional loading capacitance added in parallel with the intrinsic collector capacitance, which results in the desired value of $C_{e,c}$.

Figure 6:
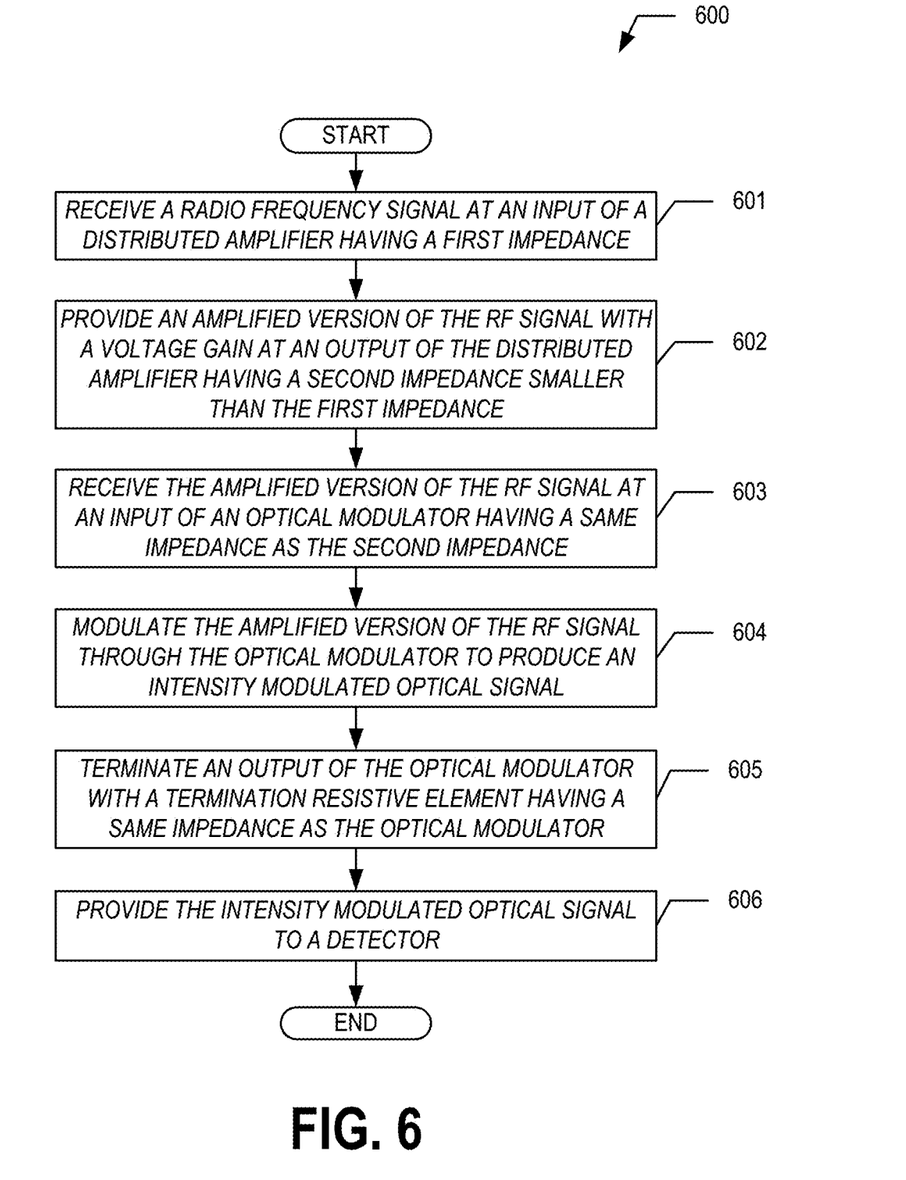
FIG. 6 illustrates a block diagram of a process for use of a low impedance optical modulator according to one or more implementations of the subject technology.

FIG. 6 illustrates a block diagram of a process 600 for use of a low impedance optical modulator according to one or more implementations of the subject technology. For explanatory purposes, the process 600 is primarily described herein with reference to the low noise amplifier circuit element 302 and the low impedance MZM circuit element 304 of the optical device 300 of FIG. 3. However, the process 600 is not limited to the low noise amplifier circuit element 302 and the low impedance MZM circuit element 304 of the optical device 300 of FIG. 3, and one or more blocks (or operations) of the process 600 may be performed by one or more other components or circuits of the optical device 300. The process 600 also is presented as an exemplary optical system and the operations described herein may be performed by any suitable amplifier and optical modulator, such as one or more of the optical modulator 204, the distributed amplifier 400 and the distributed amplifier 500. Further for explanatory purposes, the blocks of the process 600 are described herein as occurring in serial, or linearly. However, multiple blocks of the process 600 may occur in parallel. In addition, the blocks of the process 600 need not be performed in the order shown and/or one or more blocks of the process 600 need not be performed and/or can be replaced by other operations.

The process 600 starts at step 601, where an antenna (e.g., 102) receives an RF signal and provides the RF signal to an input of a distributed amplifier (e.g., 302, 400, 500) having a first impedance. Next, at step 602, the distributed amplifier (e.g., 302, 400, 500) provides an amplified version of the RF signal with a voltage gain produced through a plurality of gain stages of the distributed amplifier to an output of the distributed amplifier having a second impedance smaller than the first impedance. In some aspects, the first impedance corresponds to a standard 50-ohm impedance, and the second impedance corresponds to an impedance in a range of 15 ohms to 25 ohms. Subsequently, at step 603, the amplified version of the RF signal is received at an input of an optical modulator (e.g., 304) having a same impedance as the second impedance. Next, at step 604, the optical modulator (e.g., 106, 304) modulates the amplified version of the RF signal through the optical modulator to produce an intensity modulated optical signal. Subsequently, at step 605, the output of the optical modulator is terminated by a termination resistive element, such as a resistor, having a same impedance as the optical modulator. Next, at step 606, the optical modulator provides the intensity modulated optical signal to a detector (e.g., 108), such as a photodetector.

In one or more implementations, the process 600 includes a step for providing a first gain and an input impedance that corresponds to the first impedance at a first gain stage of the plurality of gain stages. The process 600 also includes a step for providing a second gain and an input impedance that corresponds to an output impedance of the first gain stage at a second gain stage of the plurality of gain stages. The process 600 also includes a step for providing a third gain and an input impedance that corresponds to an output impedance of the second gain stage and an output impedance that corresponds to the second impedance at a third gain stage of the plurality of gain stages.

Figure 7:
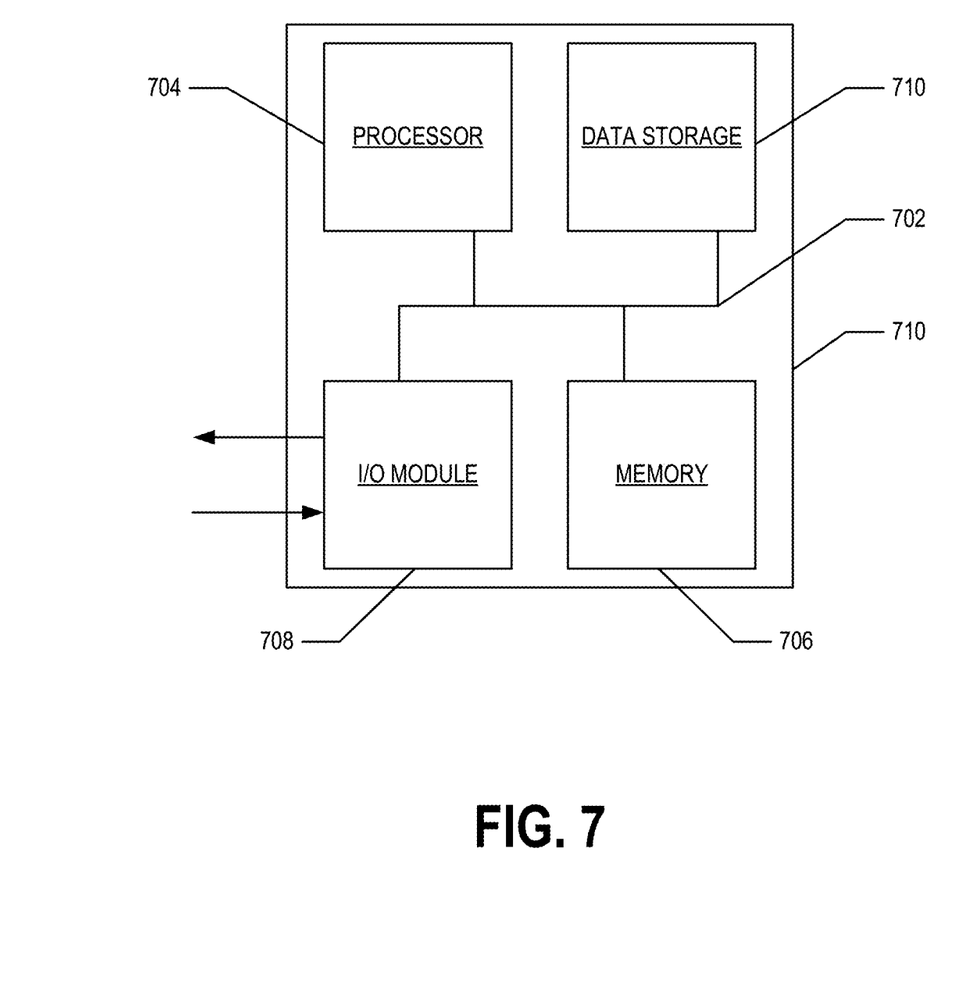
FIG. 7 is a block diagram that illustrates a computer system upon which an embodiment of the subject disclosure may be implemented.

FIG. 7 is a block diagram that illustrates a computer system 700 upon which an embodiment of the subject disclosure may be implemented. Computer system 700 includes a bus 702 or other communication mechanism for communicating information, and a processor 704 coupled with bus 702 for processing information. Computer system 700 also includes a memory 706, such as a random access memory ("RAM") or other dynamic storage device, coupled to bus 702 for storing information and instructions to be executed by processor 704. Memory 706 may also be used for storing temporary variables or other intermediate information during execution of instructions by processor 704. Computer system 700 further includes a data storage device 710, such as a magnetic disk or optical disk, coupled to bus 702 for storing information and instructions.

Computer system 700 may be coupled via I/O module 708 to a display device (not illustrated), such as a liquid crystal display ("LCD"), a light-emitting diode ("LED") display, or a combination thereof, for displaying information to a computer user. An input device, such as, for example, a keyboard or a mouse may also be coupled to computer system 700 via I/O module 708 for communicating information and command selections to processor 704.

According to one embodiment of the subject disclosure, generating and configuring a plurality of beams with an antenna system may be performed by a computer system 700 in response to processor 704 executing one or more sequences of one or more instructions contained in memory 706. Such instructions may be read into memory 706 from another machine-readable medium, such as data storage device 710. Execution of the sequences of instructions contained in main memory 706 causes processor 704 to perform the process steps described herein. One or more processors in a multi-processing arrangement may also be employed to execute the sequences of instructions contained in memory 706. In alternative embodiments, hard-wired circuitry may be used in place of or in combination with software instructions to implement various embodiments of the subject disclosure. Thus, embodiments of the subject disclosure are not limited to any specific combination of hardware circuitry and software.

The term "machine-readable medium" as used herein refers to any medium that participates in providing instructions to processor 704 for execution. Such a medium may take many forms, including, but not limited to, non-volatile media, volatile media, and transmission media. Non-volatile media include, for example, optical or magnetic disks, such as data storage device 710. Volatile media include dynamic memory, such as memory 706. Transmission media include coaxial cables, copper wire, and fiber optics, including the wires that comprise bus 702. Transmission media can also take the form of acoustic or light waves, such as those generated during radio frequency and infrared data communications. Common forms of machine-readable media include, for example, floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH EPROM, any other memory chip or cartridge, a carrier wave, or any other medium from which a computer can read.

The description of the subject technology is provided to enable any person skilled in the art to practice the various embodiments described herein. While the subject technology has been particularly described with reference to the various figures and embodiments, it should be understood that these are for illustration purposes only and should not be taken as limiting the scope of the subject technology.

There may be many other ways to implement the subject technology. Various functions and elements described herein may be partitioned differently from those shown without departing from the scope of the subject technology. Various modifications to these embodiments may be readily apparent to those skilled in the art, and generic principles defined herein may be applied to other embodiments. Thus, many changes and modifications may be made to the subject technology, by one having ordinary skill in the art, without departing from the scope of the subject technology.

A reference to an element in the singular is not intended to mean "one and only one" unless specifically stated, but rather "one or more." The term "some" refers to one or more. Underlined and/or italicized headings and subheadings are used for convenience only, do not limit the subject technology, and are not referred to in connection with the interpretation of the description of the subject technology. All structural and functional equivalents to the elements of the various embodiments described throughout this disclosure that are known or later come to be known to those of ordinary skill in the art are expressly incorporated herein by reference and intended to be encompassed by the subject technology. Moreover, nothing disclosed herein is intended to be dedicated to the public regardless of whether such disclosure is explicitly recited in the above description.

What is claimed is:

1. An optical device, comprising:
   a distributed amplifier having a plurality of gain stages, the distributed amplifier configured to receive a radio frequency (RF) signal at an input of the distributed amplifier having a first impedance and provide an amplified version of the RF signal with a voltage gain produced through the plurality of gain stages to an output of the distributed amplifier having a second impedance smaller than the first impedance; and
   an optical modulator coupled to the distributed amplifier and configured to receive the amplified version of the RF signal at an input of the optical modulator having a same impedance as the output of the distributed amplifier and modulate the amplified version of the RF signal to produce an intensity modulated optical signal at an output of the optical modulator.

2. The optical device of claim 1, further comprising:
   a termination resistive element coupled to the output of the optical modulator and configured to terminate the output of the optical modulator with a same impedance as the optical modulator.

3. The optical device of claim 1, wherein the plurality of gain stages comprises a first gain stage, a second gain stage and a third gain stage, wherein the first gain stage provides a first gain and an input impedance that corresponds to the first impedance, wherein the second gain stage provides a second gain and an input impedance that corresponds to an output impedance of the first gain stage, wherein the third gain stage provides a third gain and an input impedance that corresponds to an output impedance of the second gain stage and an output impedance that corresponds to the second impedance.

4. The optical device of claim 3, wherein the second gain corresponds to the first gain.

5. The optical device of claim 3, wherein second gain is greater than the first gain.

6. The optical device of claim 3, wherein the third gain is smaller than each of the first gain and the second gain.

7. The optical device of claim 1, wherein the optical modulator is a Mach-Zehnder interferometer.

8. The optical device of claim 1, wherein the optical modulator includes one or more coplanar waveguide transmission lines with a gap width, wherein the gap width is based on a half-wave voltage of the optical modulator.

9. The optical device of claim 8, wherein the gap width is in a range of 5 μm to 20 μm.

10. The optical device of claim 8, wherein the half-wave voltage is less than 1 volt.

11. The optical device of claim 1, wherein the second impedance is in a range of 15Ω to 25 Ω.

12. The optical device of claim 1, wherein the distributed amplifier and the optical modulator are fabricated on different semiconductor dies.

13. The optical device of claim 1, wherein the optical modulator is fabricated on a same semiconductor die as the distributed amplifier.

14. The optical device of claim 1, wherein the output of the distributed amplifier is directly coupled to the input of the optical modulator.

15. The optical device of claim 1, wherein each of the plurality of gain stages comprises an input stage and an output stage, wherein the input stage is coupled to the output stage through a first transistor and a second transistor coupled in series with the first transistor, wherein the input stage is directly coupled to a gate node of the first transistor and the output stage is directly coupled to a drain node of the second transistor, and wherein a gate node of the second transistor is biased by a bias signal set by a current mirror.

16. A method, comprising:
receiving a radio frequency (RF) signal at an input of a distributed amplifier having a first impedance;
providing an amplified version of the RF signal with a voltage gain produced through a plurality of gain stages of the distributed amplifier to an output of the distributed amplifier having a second impedance smaller than the first impedance;
receiving the amplified version of the RF signal at an input of an optical modulator having a same impedance as the second impedance;
modulating the amplified version of the RF signal through the optical modulator to produce an intensity modulated optical signal;
terminating an output of the optical modulator with a termination resistive element having a same impedance as the optical modulator; and
providing the intensity modulated optical signal to a detector.

17. The method of claim 16, wherein providing the amplified version of the RF signal comprises:
providing a first gain and an input impedance that corresponds to the first impedance at a first gain stage of the plurality of gain stages;
providing a second gain and an input impedance that corresponds to an output impedance of the first gain stage at a second gain stage of the plurality of gain stages; and
providing a third gain and an input impedance that corresponds to an output impedance of the second gain stage and an output impedance that corresponds to the second impedance at a third gain stage of the plurality of gain stages.

18. The method of claim 16, wherein the optical modulator includes one or more coplanar waveguide transmission lines with a gap width, wherein the gap width is based on a half-wave voltage of the optical modulator, wherein the gap width is in a range of 5 μm to 20 μm, wherein the half-wave voltage is less than 1 volt, and wherein the second impedance is in a range of 15Ω to 25Ω.

19. An optical system, comprising:
an optical driver configured to produce an optical train pulse;
a distributed amplifier coupled to an antenna and configured to provide an amplified version of a radio frequency (RF) signal received from the antenna through a plurality of gain stages to an output of the distributed amplifier having an impedance that is smaller than that at an input of the distributed amplifier;
an optical modulator coupled to the distributed amplifier and configured to receive the amplified version of the RF signal at an input of the optical modulator having a same impedance as the output of the distributed amplifier and modulate the amplified version of the RF signal with the optical train pulse to produce an intensity modulated optical signal at an output of the optical modulator; and
a termination resistive element coupled to the output of the optical modulator and configured to terminate the output of the optical modulator with a same impedance as the optical modulator.

20. The optical system of claim 19, wherein a transmission length of each of the plurality of gain stages is tuned to match the impedance at the output of the distributed amplifier to the impedance of the optical modulator based on a gap width of one or more coplanar waveguide transmission lines in the optical modulator.

* * * * *